United States Patent [19]

Ratzel et al.

[11] Patent Number: 5,956,497
[45] Date of Patent: Sep. 21, 1999

[54] METHODOLOGY FOR DESIGNING AN INTEGRATED CIRCUIT USING A REDUCED CELL LIBRARY FOR PRELIMINARY SYNTHESIS

[75] Inventors: Richard L. Ratzel, Westlake, Ohio; John F. Croix, Round Rock; Stephen R. King, Austin, both of Tex.

[73] Assignee: Advanced Micro Devices, Inc., Sunnyvale, Calif.

[21] Appl. No.: 08/805,597

[22] Filed: Feb. 26, 1997

[51] Int. Cl.[6] ................................................. G06F 17/50
[52] U.S. Cl. ...................................................... 395/500.02
[58] Field of Search .................................. 364/488, 489, 364/490, 491; 395/500

[56] References Cited

U.S. PATENT DOCUMENTS

| | | | |
|---|---|---|---|
| 5,619,418 | 4/1997 | Blaauw et al. | 364/489 |
| 5,666,288 | 9/1997 | Jones et al. | 364/490 |
| 5,689,432 | 11/1997 | Blaauw et al. | 364/490 |
| 5,719,783 | 2/1998 | Kerzman et al. | 364/488 |
| 5,724,250 | 3/1998 | Kerzman et al. | 364/488 |
| 5,726,903 | 3/1998 | Kerzman et al. | 364/489 |
| 5,737,236 | 4/1998 | Maziasz et al. | 364/490 |
| 5,802,349 | 9/1998 | Rigg et al. | 395/500 |
| 5,831,867 | 11/1998 | Aji et al. | 364/489 |

OTHER PUBLICATIONS

Sato et al "Post–Layout Optimization for Deep Submicron Design," IEEE, pp. 1–6, Jun. 1996.
Ramachandran et al "Combined Topological and Functionality–Based Delay Estimation Using A Layout–Driven Approach Fro High–Level Applications, " IEEE, pp. 1450–1460, Dec. 1994.

*Primary Examiner*—Kevin J. Teska
*Assistant Examiner*—Vuthe Siek
*Attorney, Agent, or Firm*—Conley, Rose & Tayon; Lawrence J. Merkel; B. Noel Kivlin

[57] ABSTRACT

A reduced cell library includes substantially fewer cells than a complete cell library used to finalize the integrated circuit design. Having fewer cells reduces the number of options available to the synthesis tool for realizing a particular RTL description. Hence, the amount of time elapsing during a synthesis run using the reduced cell library may be substantially shorter than a corresponding synthesis run using a complete cell library. The reduced cell library can be used to evaluate the RTL description of an integrated circuit without incurring long synthesis delays. Large problems in the RTL description (with respect to one or more design goals) may be detected, and the RTL description may be modified to correct the problems. Once the RTL description of the integrated circuit substantially meets the design goals of the integrated circuit using the reduced cell library, synthesis using the complete cell library is initiated. The reduced cell library may be used to evaluate alternative RTL descriptions as well as cells proposed for addition into the complete cell library. The reduced cell library can be created even when the complete cell library is not yet available. In one embodiment, each of the cells in the reduced cell library is characterized by a uniform drive strength employed by all cells in the library. Attributes for the cells are generated using design goals, constraints, and assumptions.

15 Claims, 13 Drawing Sheets

```
140
142 ─ cell ("an3s") {
      area : 269.5;
144A ─ pin(I1) {
        direction  : input;        ─ 148
        capacitance : .00383973;   ─ 150
      }
144B ─ pin(I2) {
        direction  : input;        ─ 148
        capacitance : .00383973;   ─ 150
      }
144C ─ pin(I3) {
        direction  : input;        ─ 148
        capacitance : .00383973;   ─ 150
      }
146 ─ pin(0) {
        direction  : output;       ─ 148
        capacitance : 0.0;         ─ 152
        function   : "(I1 & I2 & I3)";  ─ 154
156A ─ timing() {
        related_pin    : "I1";        ─ 158
        intrinsic_rise : 0.118636;    ─ 160
        intrinsic_fall : 0.0988636;   ─ 162
        rise_resistance : 1.76228;    ─ 164
        fall_resistance : 1.76228;    ─ 166
        slope_fall : 0.0;             ─ 170
        slope_rise : 0.0;             ─ 168
      }
156B ─ timing () {
        related_pin    : "I2";        ─ 158
        intrinsic_rise : 0.118636;    ─ 160
        intrinsic_fall : 0.0988636;   ─ 162
        rise_resistance : 1.76228;    ─ 164
        fall_resistance : 1.76228;    ─ 166
        slope_fall : 0.0;             ─ 170
        slope_rise : 0.0;             ─ 168
      }
156C ─ timing () {
        related_pin    : "I3";        ─ 158
        intrinsic_rise : 0.118636;    ─ 160
        intrinsic_fall : 0.0988636;   ─ 162
        rise_resistance : 1.76228;    ─ 164
        fall_resistance : 1.76228;    ─ 166
        slope_fall : 0.0;             ─ 170
        slope_rise : 0.0;             ─ 168
      }
    }
  }
}
```

FIG. 5

Parameters Used To Generate Reduced Cell Library
Logic Levels/Clock Cycle
Clock Cycle Time
Fanout
Clock Uncertainty
Flip Flop Delay
Flip Flop Clock to Q Time (Percentage of FF Delay)
Flip Flop Hold Time
Propagation Delay (Percentage of Gate Delay)
Rise to Fall Ratio
Wire Delay (Percentage of Load Delay)
Wire Load vs Fanout Table
Reference Cell
Delay Table
Enable Multi-level
Existing Cell Library
List of Desired Cells

FIG. 6

Basic Cell Calculations $$\text{gate\_delay} = \frac{\text{clock\_cycle} - \text{clock\_uncertainty} - \text{flip\_flop\_delay}}{\text{logic\_levels}} \leftarrow 220$$

$$\text{intrinsic\_delay} = \text{propagation\_delay} * \text{gate\_delay} \leftarrow 222$$

$$C_{\text{wire}} = \frac{(\text{gate\_delay} - \text{intrinsic\_delay}) * \text{wire\_delay}}{R_{\text{out}}} \leftarrow 224$$

$$C_{\text{in}} = \frac{\text{gate\_delay} - \text{intrinsic\_delay} - (R_{\text{out}} * C_{\text{wire}})}{\text{fanout} * R_{\text{out}}} \leftarrow 226$$

$$\text{intrinsic\_fall} = \frac{\text{intrinsic\_delay} * 2}{\text{rise\_fall\_ratio} + 1} \leftarrow 228$$

$$\text{intrinsic\_rise} = \text{intrinsic\_fall} * \text{rise\_fall\_ratio} \leftarrow 230$$

Flip - Flop Calculations $$\text{clock\_to\_q\_delay} = \text{flip\_flop\_delay} * \text{clock\_to\_q\_percentage} \leftarrow 232$$

$$\text{setup\_delay} = \text{flip\_flop\_delay} - \text{clock\_to\_q\_delay} \leftarrow 234$$

FIG. 8

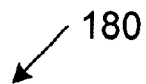

Example: Parameters Used To Generate Reduced Cell Library
Logic Levels/Clock Cycle = 15
Clock Cycle Time = 11 ns
Fanout = 3
Clock Uncertainty = 1.5 ns
Flip Flop Delay = 2.25 ns
Flip Flop Clock to Q Time (Percentage of FF Delay) = 44%
Flip Flop Hold Time = 1.5 ns
Propagation Delay (Percentage of Gate Delay) = 50%
Rise to Fall Ratio = 1.2
Wire Delay (Percentage of Load Delay) = 72%
Wire Load vs Fanout Table = 0.1125, 0.225, 0.3375, 0.4500, 0.5625, 0.6750
Reference Cell = 3 input nand (R$_{out}$ = 1.76228 kohms)
Delay Table = 0.82, 0.88, 1.00, 1.43, 1.8
Enable Multi-level = 1

FIG. 10

Example: Basic Cell Calculations $$\text{gate\_delay} = \frac{11-1.5-2.25}{15} = 0.483\text{ns} \quad \leftarrow 220$$

$$\text{intrinsic\_delay} = 0.5 * 0.483 = 0.241\text{ns} \quad \leftarrow 222$$

$$C_{wire} = \frac{(0.483-0.241)*0.72}{1.76228} = 0.099\text{pF} \quad \leftarrow 224$$

$$C_{in} = \frac{0.483-0.241-(1.76228*0.099)}{3*1.76228} = 0.013\text{pF} \quad \leftarrow 226$$

$$\text{intrinsic\_fall} = \frac{0.241*2}{1.2+1} = 0.291\text{ns} \quad \leftarrow 228$$

$$\text{intrinsic\_rise} = 0.241*1.2 = 0.289\text{ns} \quad \leftarrow 230$$

Example: Flip-Flop Calculations $$\text{clock\_to\_q\_delay} = 2.25*0.44 = 1.0\text{ns} \quad \leftarrow 232$$

$$\text{setup\_delay} = 2.25 - 1.0 = 1.25\text{ns} \quad \leftarrow 234$$

Example: Wire Load Table 0.033pF, 0.066pF, 0.099pF, 0.132pF, $\leftarrow 280$
0.165pF, 0.198pF

FIG. 11

Example: 2 Input NAND intrinsic_rise = 0.289 * 0.88 = 0.254 ns
intrinsic_fall = 0.219 * 0.88 = 0.192 ns

Example: 3 Input AND intrinsic_rise = 0.289 * (1.0 + 0.82) = 0.526 ns
intrinsic_fall = 0.219 * (1.0 + 0.82) = 0.398 ns

Example: Complex Cell

Function = (I1 | I2) & (I3 | I4)
intrinsic_rise = 0.289 * 1.43 * 2 = 0.826 ns
intrinsic_fall = 0.219 * 1.43 * 2 = 0.626 ns

FIG. 12

METHODOLOGY FOR DESIGNING AN INTEGRATED CIRCUIT USING A REDUCED CELL LIBRARY FOR PRELIMINARY SYNTHESIS

BACKGROUND OF THE INVENTION

1. Field of the Invention

This invention relates to the field of integrated circuits and, more particularly, to design methodologies for integrated circuits.

2. Description of the Relevant Art

Integrated circuits are employed in many different products. Generally, an integrated circuit includes a relatively large number of transistors (perhaps 1 to 5 million in modern integrated circuits, for example) formed upon a semiconductor substrate. The transistors are connected together using two or more wiring layers placed above the transistors, separated from the transistors and other wiring layers with an appropriate dielectric material.

Given the relatively large number of transistors included upon an integrated circuit, it is not feasible to design each transistor and its interconnection to other transistors. Instead, integrated circuit designers typically specify the operation of the integrated circuit using a high level design language (HDL) such as Verilog or VHDL. The description of the integrated circuit is typically a register-transfer level (RTL) description. An RTL description comprises multiple storage devices (e.g. the "registers") which store a current state of the integrated circuit, and a set of logical equations defining a next state of the integrated circuit. The next state is stored in the storage devices according to a clock signal defined for the integrated circuit. The clock signal defines the interval of time in which the next state is to be computed, and is used by the storage devices to determine when to sample an input to the storage device. The input thus sampled is stored in the storage device until the subsequent sampling point occurs upon the clock signal. For example, the rising or falling edge of the clock signal may be used as a sampling point. Alternatively, a storage device may "open" (i.e. allow the input to pass through to the output) during one phase of the clock signal (e.g. logical high or logical low value), and "close" (i.e. store the value upon the input regardless of subsequent changes upon the input) during the other phase of the clock signal. One period of the clock signal is referred to as a clock cycle.

HDLs can be used to provide a readily understandable description of the operation of an integrated circuit. The RTL description may be read by a person unfamiliar with the integrated circuit's operation, and the person may come to an understanding of the operation more quickly than if the person studied the transistors which implement the integrated circuit. However, RTL descriptions must be compiled into a list of transistors and their relative placement upon the semiconductor substrate, as well as a description of the wiring layers used to interconnect the transistors, in order to actually manufacture the integrated circuit. Typically, the integrated circuit design is divided into multiple partitions. At least one RTL description file is associated with each partition.

The process of compiling an RTL description includes a first compiling step, referred to as synthesis, which converts the RTL description into a list of cells and interconnection there between. The list of cells interconnected as specified by the synthesis tool implements the logical next state equations of the RTL description, as well as the storage devices in the RTL description. The cells available to the synthesis tool are provided to the synthesis tool in the form of a cell library comprising multiple cells. Each cell has a set of attributes defining the cell's logical, electrical, and physical properties. One cell attribute is a logical function (such as AND, OR, NAND, NOR, etc., or a complex logical function implementing an equation of basic logical functions) between one or more input pins and one or more output pins of the cell. A second cell attribute is timing information regarding the delay between a signal arriving at a particular input to the cell and an output signal from the cell reacting to the input signal. Each cell is associated with a corresponding circuit including a set of transistors arranged for placement upon an integrated circuit and interconnect between the transistors. The area occupied by the corresponding circuit is a third cell attribute included in the cell library. Furthermore, the timing information referred to above is derived from the circuit and from parameters defined for the semiconductor fabrication process in which the circuit is to be implemented.

The synthesis tool uses the logical functions of the cells in the library to realize the logical next state equations defined in the RTL description. Additionally provided to the synthesis tool is a set of constraints for the design, including a maximum desired clock cycle time and maximum area for the integrated circuit (or portion thereof, in the case of a partitioned integrated circuit). The synthesis tool attempts to realize the RTL description using the cell library within the clock cycle time and area constraints, as well as any other constraints provided to the synthesis tool.

The RTL description of the integrated circuit is typically synthesized multiple times during the design of the integrated circuit. The early synthesis results tend to include a number of logic paths (i.e. interconnected levels of cells between two storage devices) which do not meet the design constraints. Integrated circuit designers analyze the results of the earlier synthesis runs and change the integrated circuit design and/or optimize the RTL description to improve the results of later synthesis runs. Once a design has substantially achieved the design constraints, a second compiling step is performed. The lists of cells corresponding to each partition of the integrated circuit and interconnect between the partitions are "laid out" (i.e. placed within the confines of the desired integrated circuit dimensions) and the wiring between the partitions is routed through the wiring layers. Once the layout is completed, an extraction of the capacitance for the interconnect can be performed, and a final timing analysis including the interconnect delay and delays for the cells is performed to verify that the integrated circuit meets the design goals for the integrated circuit.

A typical cell library includes multiple cells implementing the same basic logical function (e.g. AND, OR, NAND, NOR, etc.) or complex logical function. The multiple cells correspond to different circuits. The number and configuration of the transistors may vary between the circuits corresponding to each of the cells. Alternatively, the "drive strength" may be varied between different circuits having the same number and configuration of transistors. The drive strength is a measure of the circuits ability to charge/discharge a largely capacitive load (e.g. the input pins of other cells plus the wiring there between). A high drive strength indicates the ability to charge/discharge a large load quickly, while a low drive strength indicates a longer time period for charging/discharging a large load. The drive strength may be characterized by an output resistance for the cell. Typically, a circuit having a higher drive strength occupies more area than an equivalent circuit having a lower drive strength (the transistors are made larger to increase the drive strength, for example).

The synthesis tool uses the multiple cells corresponding to a given logical function to realize the RTL description within the area, timing, and other constraints for the integrated circuit. If the timing of a particular logic path is not close to the maximum desired clock cycle time, then cells having a lower drive strength may be selected for that path to minimize the area occupied by those circuits. Additionally, different combinations of cells may form the same overall logical functions, and the different combinations may have different timing and area characteristics. The synthesis tool tries different combinations of drive strengths and different combinations of cells to realize a given RTL description. If none of the selected combinations can realize the RTL description within the design constraints, the synthesis tool selects the combination which is closest to achieving the constraints. Generally speaking, a synthesis tool is a computer program which performs integrated circuit design synthesis. An exemplary synthesis tool is the Design Compiler family of tools available from Synopsys, Inc. of Mountainview, Calif.

Unfortunately, the time required to synthesize an RTL description given multiple drive strengths per logical function and/or multiple circuit types providing an equivalent function can be prohibitive. The time required is particularly prohibitive during the early synthesis attempts performed upon the RTL description. The RTL description provided during the early attempts to synthesize the integrated circuit may require significant optimization before an acceptable synthesis result can be achieved. Additionally, the functionality of the RTL description may need to be modified to achieve an acceptable synthesis result. These early synthesis attempts, then, provide an evaluation of the RTL description and the integrated circuit design itself. Therefore, it is desirable to be able to quickly synthesize an RTL description in order to evaluate the RTL.

In some cases, a library of cells corresponding to a set of circuits designed for a particular semiconductor fabrication process may not be available until after initiation of synthesis is desired. The design cycle (i.e. the time elapsing between defining the design goals of an integrated circuit and the fabrication of the integrated circuit) may be lengthened by the inability to evaluate the RTL description of the integrated circuit earlier in the design cycle.

SUMMARY OF THE INVENTION

The problems outlined above are in large part solved by a design methodology in accordance with the present invention. According to the methodology, a reduced cell library is generated. The reduced cell library includes substantially fewer cells than a complete cell library used to finalize the integrated circuit design. Having fewer cells reduces the number of options available to the synthesis tool for realizing a particular RTL description. Hence, the amount of time elapsing during a synthesis run using the reduced cell library may be substantially shorter than a corresponding synthesis run using a complete cell library. Advantageously, the reduced cell library can be used to evaluate the RTL description of an integrated circuit without incurring long synthesis delays. Large problems in the RTL description (with respect to one or more design goals) may be detected rapidly, and the RTL description may be modified to correct the problems. Iteratively synthesizing and modifying the RTL description using the reduced cell library for synthesis is more rapidly completed due to the reduced synthesis time. Once the RTL description of the integrated circuit meets the design goals of the integrated circuit (within a specified tolerance) using the reduced cell library, synthesis using the complete cell library is initiated. The number of synthesis/modification iterations performed using the complete cell library may be advantageously reduced.

In addition to using the reduced cell library for early RTL description evaluation, the reduced cell library is beneficial in evaluating alternative RTL descriptions. Because of the rapid synthesis time, many alternatives may be explored without investing a large amount of time in synthesizing the alternatives. Still further, cells proposed for addition into the complete cell library can be evaluated by including the proposed cells in the reduced cell library and synthesizing the RTL description. By observing the usage rate of the proposed cell, the integrated circuit designer may decide upon the utility of the proposed cell. Advantageously, the proposed cell is evaluated prior to performing the corresponding circuit design for the proposed cell. Finally, the reduced cell library can be created even when the complete cell library is not yet available. In this manner, RTL evaluation and optimization may begin before the complete cell library is available.

In one embodiment, each of the cells in the reduced cell library is characterized by a uniform drive strength employed by all cells in the library. Attributes for the cells are generated using design goals, constraints, and assumptions. By synthesizing with the RCL, the RTL description can be evaluated against the design goals and assumptions. Providing this feedback to the integrated circuit designer allows for earlier detection of shortfalls of the RTL descriptions. More time may thereby be available for correcting the problems without causing the design cycle of the integrated circuit to be lengthened.

Broadly speaking, the present invention contemplates a method for designing an integrated circuit. A reduced cell library is generated. Each cell of the reduced cell library is characterized by a uniform drive strength. An RTL representation of the integrated circuit is synthesized using cells defined only within the reduced cell library.

The present invention further contemplates a computer system comprising a processing unit and a storage medium. The processing unit is configured to perform operations in response to a program. Coupled to the processing unit, the storage medium stores a reduced cell library for use in synthesizing an RTL representation of an integrated circuit. Each cell of the reduced cell library is characterized by a uniform drive strength employed by each of the first set of cells.

The present invention still further contemplates a method for designing an integrated circuit. A reduced cell library is generated. A first set of attributes corresponding to each cell within the reduced cell library are estimated from a set of parameters of a semiconductor fabrication process to be used to manufacture the integrated circuit and from a set of design goals of the integrated circuit. An RTL description of the integrated circuit is synthesized using cells defined only within the reduced cell library. A cell library is generated, wherein a second set of attributes corresponding to each cell within the cell library are derived from a corresponding set of circuits employed within the semiconductor fabrication process. The RTL description is synthesized using cells from the cell library.

BRIEF DESCRIPTION OF THE DRAWINGS

Other objects and advantages of the invention will become apparent upon reading the following detailed description and upon reference to the accompanying drawings in which:

FIG. 5 is an exemplary cell for use in one embodiment of a reduced cell library.

FIG. 6 is a table of parameters provided by a user to generate one embodiment of a reduced cell library.

FIG. 8 is a list of equations for calculating basic attributes for cells in one embodiment of a reduced cell library.

FIG. 10 depicts an exemplary set of input parameters for generating an RCL.

FIG. 11 depicts an evaluation of the equations shown in FIG. 8 for the exemplary set of input parameters shown in FIG. 10 and an exemplary wire load table.

FIG. 12 shows the intrinsic delay values for several exemplary cells using the exemplary values of FIG. 10 and the corresponding calculations from FIG. 11.

Figure 1A:
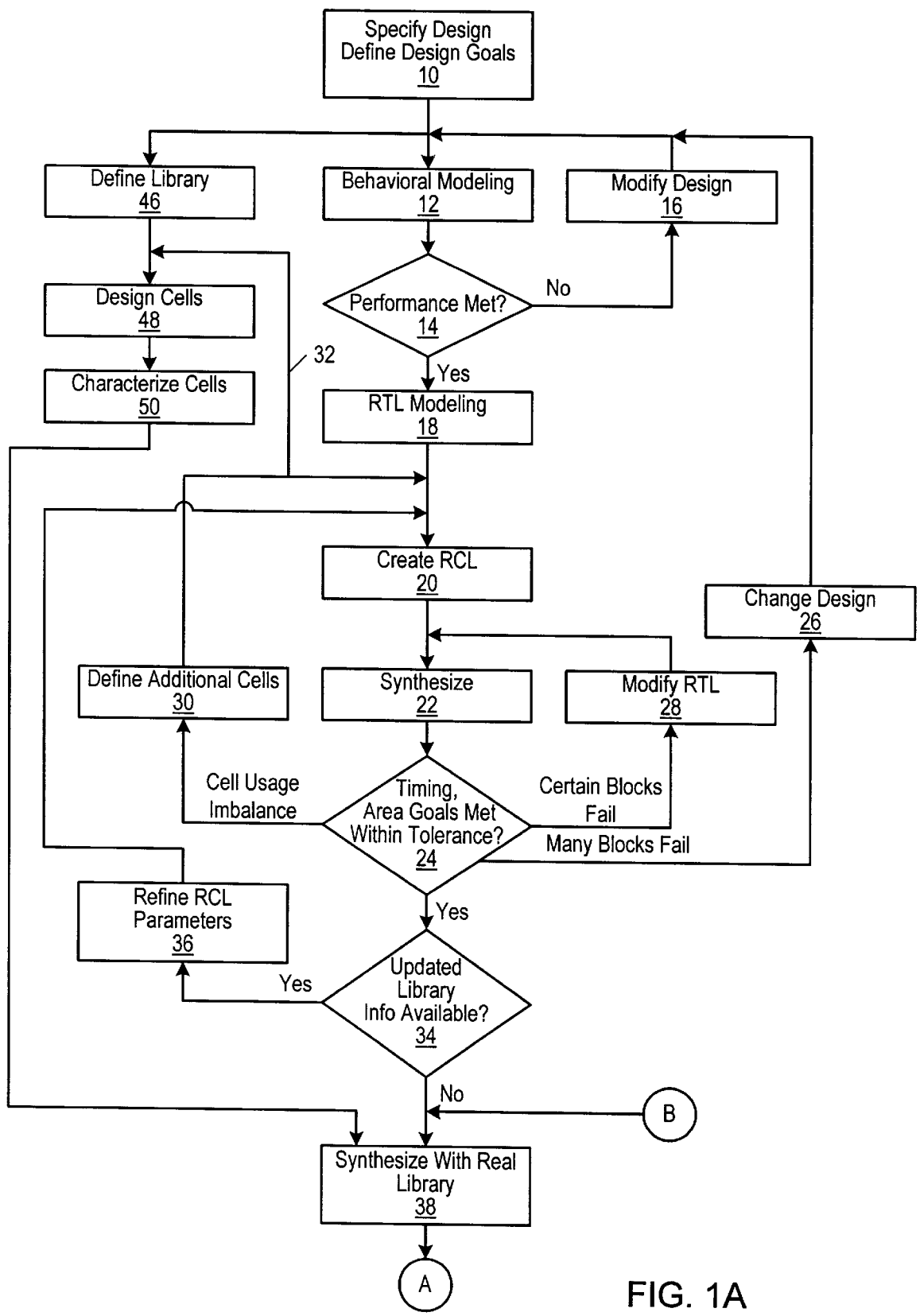
FIGS. 1A and 1B are a flow chart of a design methodology.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 1B:
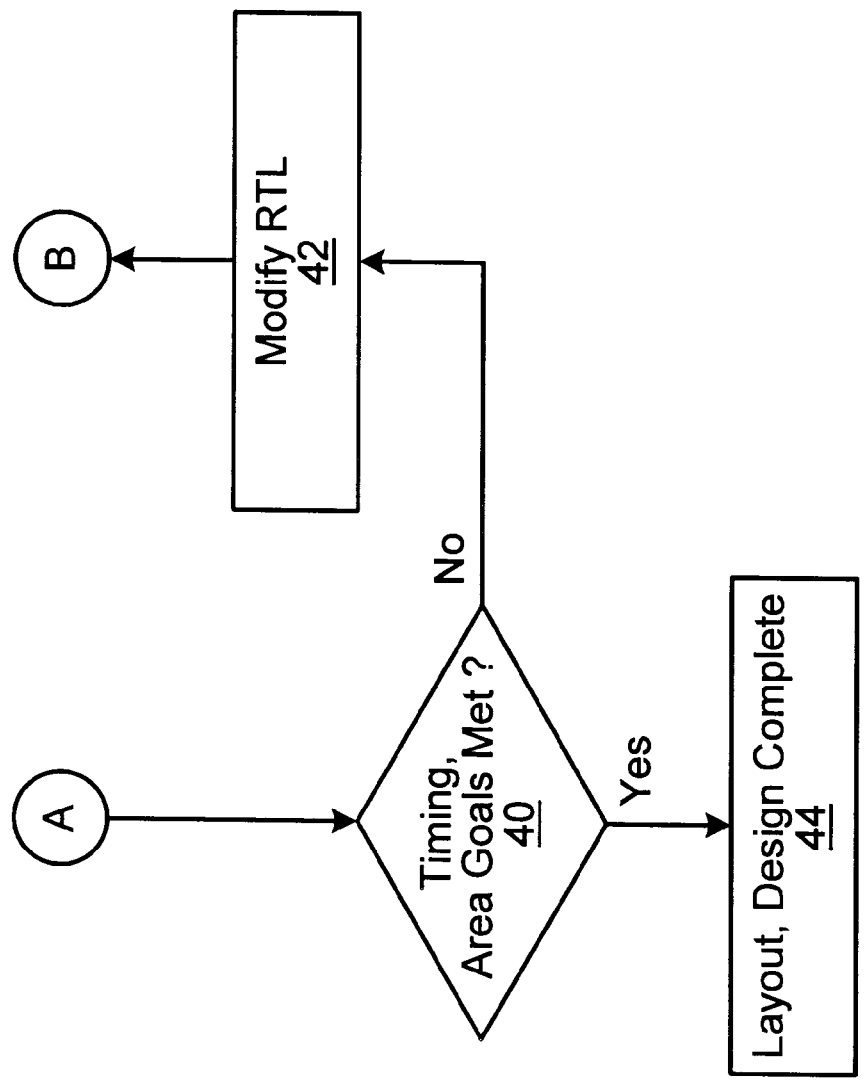

Turning now to FIGS. 1A and 1B, a flow chart illustrating certain steps of a design methodology for an integrated circuit is shown. The steps shown in FIG. 1A and 1B include the steps for synthesizing a design and determining its timing and area parameters. Other steps, not shown, are used to verify performance characteristics at each stage of the design, as well as the functional correctness of the design. Furthermore, verification of the equivalence of the behavioral level model, the RTL model, and the final design representation at tapeout are verified.

Generally speaking, the design flow shown in FIG. 1 includes the creation of a reduced cell library (RCL). The RCL includes a relatively small number of cells as compared to a typical cell library used to form the final design as manufactured (the "complete cell library"). Because fewer cells are included, the synthesis tool may complete a synthesis of the RTL representation of the integrated circuit quickly. There are few options for each logic path, and therefore the synthesis tool is able to quickly decide upon a set of cells for implementing the RTL description. Advantageously, synthesis runs may be completed rapidly upon a particular RTL description. The RTL description can thereby be quickly evaluated as being approximately capable of achieving design/area constraints. Furthermore, since the synthesis time is short, a designer may more easily evaluate alternative implementations and enhancements by coding the alternative RTL descriptions and synthesizing the alternatives. The RCL may be particularly useful when the cell library to be used for the design is not yet completed (i.e. corresponding circuits are not yet available or characterized to provide cell attributes). Furthermore, the RCL can be used to evaluate additions to the complete cell library. By adding the proposed cell to the RCL, synthesizing the RTL representation, and analyzing the usage of the proposed cell, an evaluation of the usefulness of the proposed cell can be performed. If the proposed cell is used relatively often, it may be included in the complete cell library. If the proposed cell is rarely used, it may be excluded from the complete cell library. Many other advantages of using the RCL are contemplated.

In one embodiment, cells in the RCL are created from an existing cell library. The integrated circuit designer selects a set of cells from the existing cell library to form the RCL. One of the cells is designated as a reference cell, and the reference cell defines a uniform drive strength which will be applied to each of the cells in the RCL. In other words, each of the cells within the RCL employs a uniform drive strength. Therefore, cells which are logically equivalent to other cells but provide different drive strengths are not included in the RCL. In one particular embodiment, 52 cells are included in the RCL including: 14 basic logical cells (2, 3, and 4 inputs to one output), 12 complex logical cells (AND of inputs followed by OR of the AND outputs and vice versa), 12 basic logical cells with one or more inverted inputs (2, 3, and 4 input), 7 multiplexor cells (2 input through 8 input), a flip flop storage device, an inverter, and a buffer. The number of cells in the RCL can be compared to approximately 1200 cells which may be included in an exemplary complete cell library.

The input capacitance and intrinsic delay attributes of the cells are calculated based upon the design goals of the integrated circuit, as opposed to being derived from a particular circuit. In this manner, an RCL may be created even if a cell library for the semiconductor fabrication process to be used to manufacture the integrated circuit is not available. If such a cell library is not available, the existing cell library used as a base to generate the RCL may be a cell library for another semiconductor fabrication process. The design goals used to generate the RCL are a number of logic levels includable in the desired clock cycle time, the desired clock cycle time, the assumed distribution of load capacitance between wiring and loads (i.e. input pins to the subsequent cells), the average fanout assumed for the design (i.e. number of loads), etc. Even when a complete cell library is available, the design goals are estimates of what may be achievable. For example, the number of logic levels includable in a clock cycle is dependent upon the amount of delay attributable to wiring between cells (which is dependent upon the final layout of the integrated circuit).

The steps of the flowchart shown in FIGS. 1A and 1B are described next. First, a design is specified (step 10). The specification defines a set of design goals which typically include a maximum area (or die size), a maximum clock cycle time, a maximum power dissipation, and a performance requirement. The performance requirement is often specified in terms of an industry standard benchmark. For example, microprocessors employ a variety of benchmarks including the System Performance Evaluation Cooperative (SPEC) integer and floating point benchmarks. The SPEC benchmarks include a set of programs designed to stress microprocessor designs in order to determine their performance characteristics.

Once the design has been specified, a design implementation is determined and modeled at a behavioral level in order to measure expected performance of the implementation (step 12). Behavioral modeling is more abstract than RTL modeling, and is often performed in a high level program language such as C or C++. Typically, an integrated circuit design is partitioned into multiple functional blocks (or partition blocks). Each functional block is assigned a specified behavior and an interface to other functional blocks with which that functional block communicates. When the functional blocks are connected together, they perform the operation specified for the integrated circuit.

The behavioral model is then simulated against the performance benchmarks (or selected portions thereof) to determine whether or not the performance design goals are met (step 14). If the performance goals are not met, the design is modified (step 16). A new behavioral model is created (step 12) and then simulated. Steps 12, 14, and 16 are iterated until an implementation with acceptable performance characteristics is realized.

Upon successful completion of behavioral modeling, an RTL representation of the integrated circuit is coded (step 18). The RTL representation is typically coded in partitions as defined for the design implementation. Hence, the RTL representation of the integrated circuit may exist in multiple files on a computer system used to carry out the design methodology of FIGS. 1A and 1B. Each file is typically synthesized separately.

In addition to creating the RTL model, a reduced cell library is created (step 20). As mentioned above and described in more detail below, the RCL is created according to a set of design goals and constraints. The goals are based in part upon the expected parameters of the semiconductor fabrication process in which the integrated circuit is to be manufactured. For example, the electrical characteristics of the transistors formed using the semiconductors fabrication process affect the intrinsic delay of the cells, the input capacitance of the cells, etc.

The RTL description created in step 18 is synthesized using the RCL created in step 20 using the synthesis tool (step 22). Prior to the synthesis step, the integrated circuit designer has little feedback about whether or not the RTL description (or the structure of the design itself) is capable of meeting the design goals. Synthesizing using the RCL may provide such feedback. The synthesis result (a netlist describing instantiations of the cells selected during synthesis and an interconnection between the instantiations) is examined to determine if the timing and area goals have been reached within a certain tolerance (step 24). For example, a tolerance of plus or minus 20% of the timing and area goals may be selected. Generally, a timing tool is used to examine the netlist and determine the amount of time occupied by each logic path according to the corresponding delays specified in the RCL. If the synthesis result does not indicate that the RTL description synthesized into a netlist which meets the design goals within the selected tolerance, then synthesis using the RCL may be iterated.

If synthesis using the RCL does not indicate that the design goals are met within the selected tolerance, several courses of action are possible. If many of the blocks in the design fail to meet the design goals by a large margin, a design change may be necessary (step 26). If so, the behavioral model is changed accordingly and the behavioral modeling steps are repeated. Since the RCL allows for relatively quick analysis of the RTL model, problems requiring design changes may be located early in the design process. The design changes can be made prior to investing a large amount of time in the unworkable design.

Another possible outcome of synthesis using the RCL is that certain portions of the blocks do not meet design goals, but many other portions of the blocks do meet design goals (or at least substantially meet design goals). In such cases, the portions of the RTL description which are not meeting design goals may be modified (step 28). The modifications may include reorganizing the RTL to perform a Boolean equivalent function (i.e. the next states are logically the same as the current states), but the next state equations are modified in such a way that synthesis produces a netlist which meets timing goals. In such cases, the HDL constructs originally used are constructs which do not synthesis as well as expected. Non-Boolean Equivalent changes may also be required. For example, a state machine within a given partition may need to be redesigned to meet the design goals. Yet another potential outcome is that the designer may detect a group of cells which is often used to form a particular function. The function may be more efficiently realized by creating a cell which implements the function (e.g. the function may be realized with fewer transistors, or the wiring delay and area may be decreased by placing all the transistors into a single cell). In such cases, the designer may propose additional cells to be included in the RCL (step 30). The additional cells are added to the RCL, creating a new RCL. The RTL description is synthesized using the new RCL, and usage rates of the new cell are analyzed. If the synthesis tool employs the proposed cell often, then the proposed cell may become a part of the complete cell library used for final synthesis of the design. As such, step 30 may provide feedback to the design of the complete cell library (e.g. line 32).

In addition to refining the RCL through adding additional cells, the RCL may be refined through updated information from design of the cell library or from updated design goals (step 34). Upon receipt of updated information, the RCL is regenerated using updated RCL parameters (step 36). Subsequently, the RTL description is resynthesized using the newly generated RCL.

The steps of synthesizing the RTL description and making modifications to either the RTL description or the RCL can be iterated until the design goals of the integrated circuit are substantially achieved. Because the time elapsing for each synthesis run is small compared to the time used to synthesis with the complete cell library, the overall time spent optimizing the design may advantageously be reduced. Once an acceptable RTL description is realized, synthesis using the complete cell library may be performed (step 38). As FIG. 1A shows, the complete cell library must be available via the library design process to synthesize using the complete cell library. The library design process is described below. Because the RTL description synthesizes to a netlist which substantially meets the design goals (for example, within 20%–25% of the target clock cycle time and area goals may be defined to substantially meet design goals), the number of iterations of synthesis using the complete cell library is reduced. However, because the RCL is an estimate of the complete cell library, a minor amount of further modification may be necessary (steps 40 and 42). Once the timing and area goals are met using the complete cell library, the final set of netlists for the blocks comprising the integrated circuit are laid out, final wiring capacitances are extracted, and a final timing check is performed. If the timing check (and a corresponding final area check) passes, then the design is completed (step 44). It is noted that many other verification steps not shown in FIGS. 1A and 1B are often performed for reasons other than timing and area verification.

In parallel with modeling the design at behavioral and RTL levels, a complete cell library and corresponding circuitry implementing the cell in the semiconductor fabrication process to be used to manufacture the integrated circuit is designed. It is noted that the library may be designed prior to the design of the integrated circuit. Designing the complete cell library comprises defining the library of cells (including the various drive strengths to be employed for each type of cell), designing each of the circuits corresponding to the cells, and characterizing the circuits to develop the timing information for the complete cell library (steps 46, 48, and 50, respectively). It is noted that the library definition according to step 46 may receive input according to additional cells proposed and evaluated using the RCL and synthesizing the RTL description with the additional cells included. Designing the cells involves laying out the transistors included in the cell and optimizing the sizes of the transistors to produce the desired drive strength while reducing the area occupied by the cell and the input capacitance of the cell, etc. Finally, characterizing the cell involves simulating the cell (for example using SPICE simulation) throughout the available process window to determine the electrical characteristics of the cell. A process window refers to a certain amount of variation in the semiconductor fabrication process which occurs despite strict process regulation controls. Other variations may be intentionally created to increase yield, to increase the number of integrated circuits which may operate in a shorter clock cycle time, etc. The variations may occur from semiconductor wafer to semiconductor wafer and between integrated circuit instantiations across the semiconductor wafer. The integrated circuit, to be considered manufacturable, must operate within design goals for any variation in the process which occurs within the window. By characterizing the cells with respect to the allowable variations, an integrated circuit which operates across the window is more likely to be achieved. Exemplary variations during the semiconductor fabrication process may include temperature and/or pressure variations during various fabrication stages.

Figure 2:
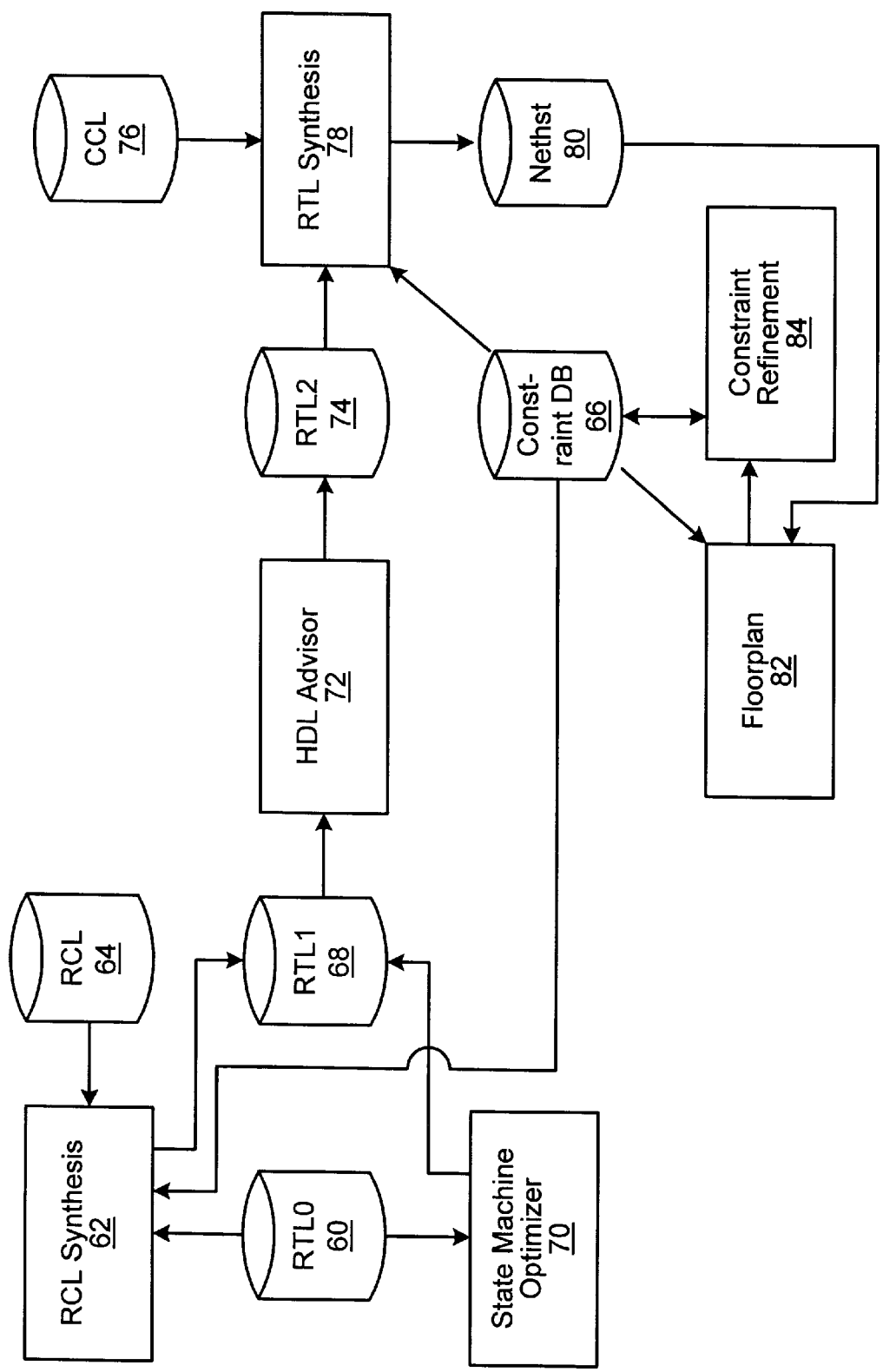
FIG. 2 is a portion of a design flow for an integrated circuit.

Turning now to FIG. 2, a portion of a design flow for an integrated circuit is shown. The design flow shown in FIG. 2 is consistent with steps 22–44 as shown in the flowchart of FIGS. 1A and 1B. A first version of the RTL description (RTL0 60) is provided to the synthesis tool for performing RCL synthesis 62 using the reduced cell library 64. The synthesis tool additionally receives the constraint database 66 which defines certain design goals such as maximum clock cycle time, maximum desired fanout, maximum capacitive load, etc. The synthesis tool synthesizes RTL0 60 using RCL library 64, and RTL0 60 is refined into a second version of the RTL description (RTL1 68). RTL1 68 may also be modified via the input of a state machine optimization tool 70. State machine optimization tool 70 attempts to optimize the state machines within the RTL description (i.e. by changing the encodings of the states, etc.) such that the state machines may be realized in fewer levels of logic or fewer total gates. An exemplary state machine optimization tool 70 is the TriQuest Controller Architect available from TriQuest Design Automation, Inc. of San Jose, Calif.

RTL1 68 may then be analyzed using an HDL advisor tool 72. The HDL advisor tool 72 allows the designer to view RTL1 68 graphically. The designer may thereby visually locate areas of inefficiency in RTL1 68, creating a third version of the RTL description (RTL2 74). RTL2 74 is subsequently synthesized using the complete cell library (CCL 76) during RTL synthesis 78. RTL synthesis 78 is performed by the same synthesis tool which performs RCL synthesis 62. The synthesis tool produces a netlist 80 which is provided to a floorplanning tool to perform floorplanning functions (reference number 82). The resulting floorplan may provide refinements to the constraint database 66 (reference number 84). For example, a wire load model may be provided. The wire load model is derived from the relative placement of blocks within the floorplan and the size of each of the blocks. Thus, as synthesis iterations are performed, the wire load model may change based on the evolving results of the synthesis. The floorplanning functions include placing the partitioned blocks within the boundaries for the integrated circuit, performing global wiring (i.e. connecting the partitioned blocks together) and extracting the wiring capacitances for the global wiring for the final timing analysis.

Figure 3:
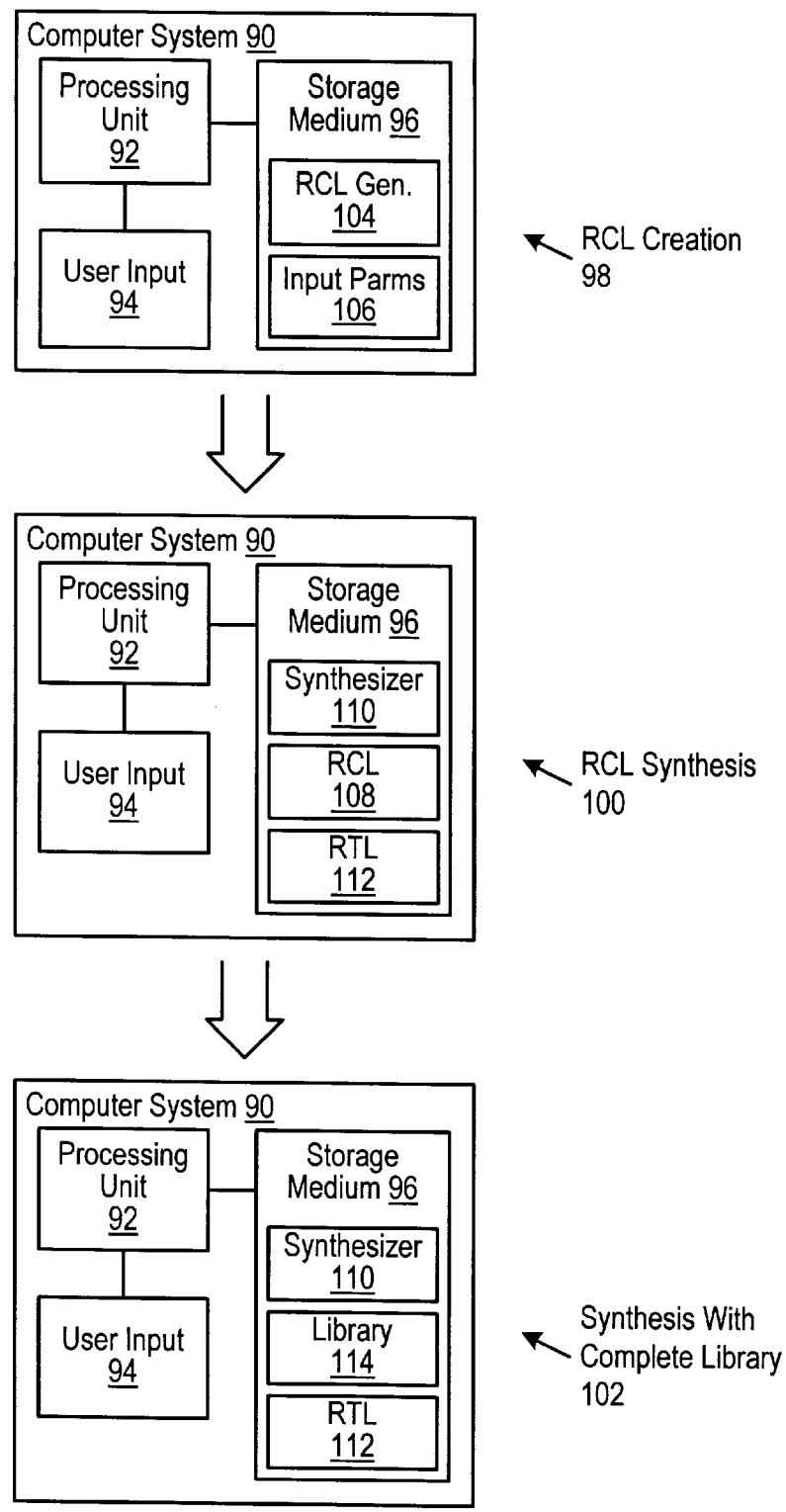
FIG. 3 depicts a computer system at various stages during the flow chart shown in FIG. 1.

Turning next to FIG. 3, a diagram depicting a computer system 90 during various stages of the design methodology shown in FIGS. 1A, 1B, and 2. Computer system 90 is configured for performing various activities in support of the design methodology. Computer system 90 includes a processing unit 92, a user input device 94, and a storage medium 96. Processing unit 92 is coupled to user input device 94 and storage medium 96. Processing unit 92 includes at least one processor, as well as any optional external caching desired for optimal performance of the processor. User input device 94 may be any device adapted for allowing human input into computer 90. For example, user input device 94 may include a keyboard, a mouse, a tablet, a touch screen interface, or any other similar input device.

Storage medium 96 is adapted for storing programs and corresponding data for manipulation by processing unit 92. Storage medium 96 may include a main memory system comprising multiple dynamic random access memory (DRAM) cells. Additionally, storage medium 96 may comprise a fixed disk drive, CD-ROM, or other non-volatile storage device configured to store data. In one embodiment, computer system 90 employs the UNIX operation system, although any operation system may be employed in various embodiments.

Computer system 90 is shown at an RCL creation step 98, an RCL synthesis step 100, and a synthesis with complete library step 102. During RCL creation step 98, storage medium 96 stores an RCL generation tool 104 and an input parameters set 106. RCL generation tool 104 is configured to generate a reduced cell library in accordance with the input parameters supplied in input parameters set 106. Input parameters set 106 may include an existing library, a list of cells desired in the RCL, etc. A flowchart illustrating one embodiment of an RCL generation tool is shown as FIG. 9. An exemplary list of user input parameters is shown as FIG. 6.

During RCL synthesis 100, storage medium 96 stores an RCL 108 created during RCL creation step 98. Furthermore, storage medium 96 stores a synthesis tool 110 and an RTL description 112. Processing unit 92 executes the synthesis tool 110 upon the RTL description 112 using the RCL 108. Additionally, storage medium 96 may store the constraint database shown in FIG. 2.

During synthesis with complete library step 102, storage medium 96 stores the synthesis tool 110 and the RTL description 112. Additionally, storage medium 96 stores the complete cell library 114. Similar to RCL synthesis step 100, processing unit 92 executes the synthesis tool 110 upon the RTL description 112. However, the complete cell library 114 is used as the input library. Again, storage medium 96 may additional store the constraint database shown in FIG. 2.

Although FIG. 3 depicts a single computer system 90, it is noted that each of the steps shown in FIG. 3 may be performed upon different computer systems. Furthermore, a networked group of computer systems may be used to perform the steps shown in FIG. 3.

Figure 4:
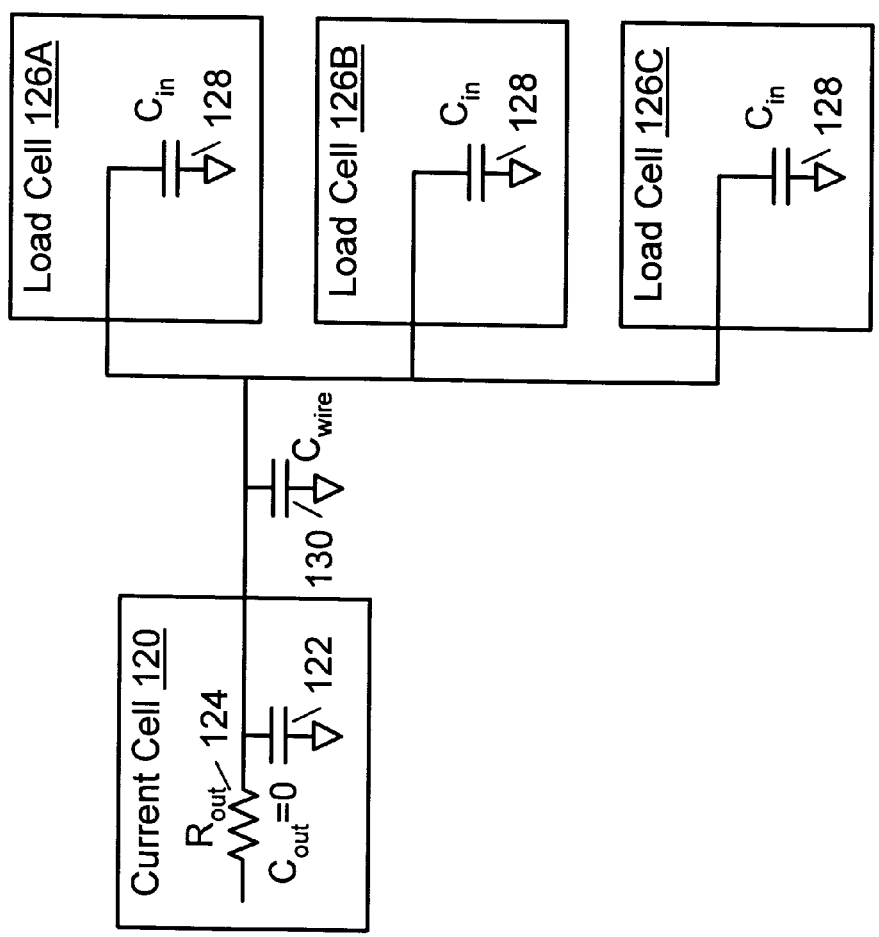
FIG. 4 is a circuit diagram of a delay model employed by one embodiment of a reduced cell library.

Turning next to FIG. 4, a circuit diagram of a delay model employed according to one embodiment of the reduced cell library is shown. The delay model shown in FIG. 4 is used to generate the intrinsic delay and input capacitance values to be associated with each cell. FIG. 4 depicts a current cell 120 having an output capacitance $C_{out}$ 122 and an output resistance $R_{out}$ 124. It is noted that the output resistance (a measure of the drive strength of current cell 120) is actually a rising resistance $R_{rise}$ and a falling resistance $R_{fall}$. Typically, $R_{fall}$ is somewhat less than $R_{rise}$. However, for purposes of the delay model Rout is calculated and the difference between rise times (i.e. the amount of time to transition from a logical low level to a logical high level on the output of current cell 120) and fall times (i.e. the amount of time to transition from a logical high level to a logical low level) is specified by the user via an input parameter. The input parameter specifies a difference in the intrinsic rise and fall times of the cell. Furthermore, the output capacitance $C_{out}$ is assumed to be zero to simplify the delay model. Current cell 120 is coupled to a plurality of load cells 126A, 126B and 126C. Each load cell 126 has associated therewith an input capacitance $C_{in}$ 128. In the delay model, each $C_{in}$ 128 is assumed to be numerically equal to each other $C_{in}$ 128. The number of load cells in the delay model is specified by the fanout input parameter supplied by the user. In other words, the fanout is the number of input loads applied to the current cell 120. Additionally, the wiring between current cell 120 and load cells 126 has an associated capacitance $C_{wire}$ 130.

The delay associated with current cell 120 can be calculated from the following equation giving the delay model shown in FIG. 4:

$$\text{delay} = \text{intrinsic\_delay} + R_{out} * (C_{wire} + \text{fanout} * C_{in}) \quad (1)$$

The intrinsic_delay of a cell is the delay between an input signal switching and the output signal reacting to the input signal even if the cell were unloaded. Included in the intrinsic delay is the switching speed of the transistors (e.g. the time to form a channel beneath the gate in a CMOS transistor, among other things).

Equation (1) can be rewritten as equation (2) below:

$$\text{delay} = \text{intrinsic\_delay} + R_{out}C_{wire} + \text{fanout} * R_{out}C_{in} \quad (2)$$

or, equivalently, equation (3):

$$\text{delay} = \text{intrinsic\_delay} + \text{wiring\_delay} + \text{load\_delay} \quad (3)$$

Another factor in the delay of a given cell is the slope of the input signal to the cell during the rise or fall of the input signal. This factor is often negligible with respect to the factors in equation (1) above (particularly if the drive strength is sufficient to make the rising and falling slopes nearly vertical). Therefore, the slope factors are assumed to be zero to simplify the RCL in the present embodiment.

Figure 9:
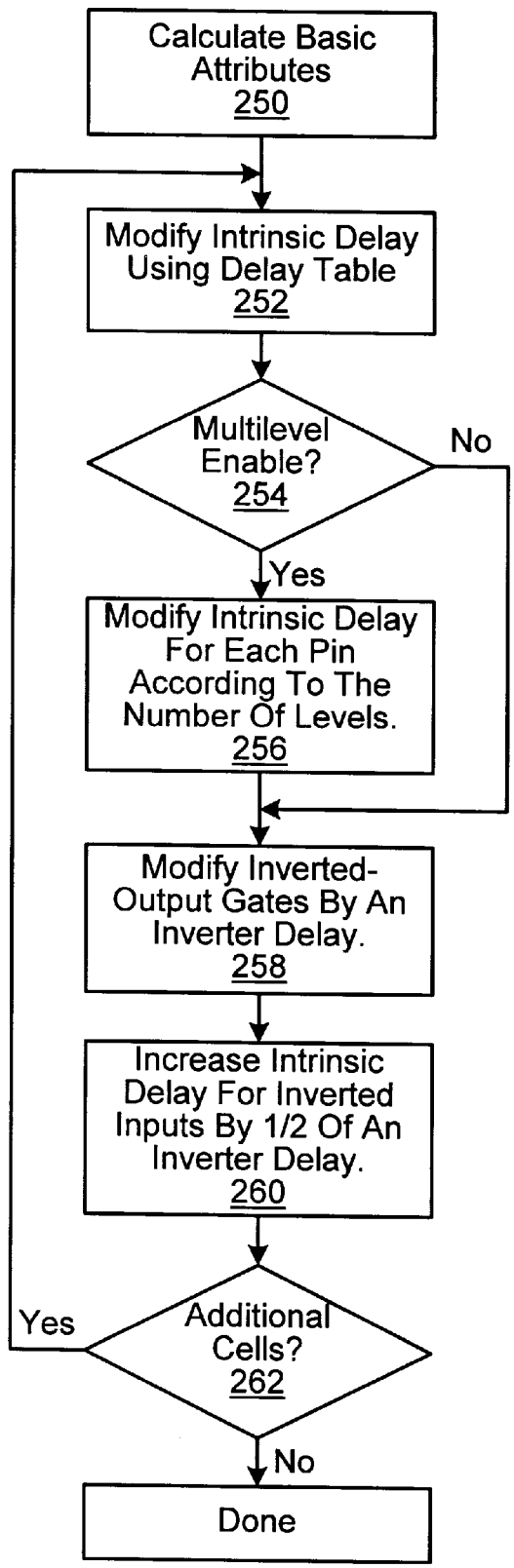
FIG. 9 is a flow chart for a program to generate one embodiment of a reduced cell library.

Given a set of input parameters shown in FIG. 6, the components of equation (1) can be calculated according to the equations given in FIG. 8. Once the components of equation (1) are calculated, corresponding values can be assigned to each cell in the reduced cell library by modifying the components in equation (1) based upon the type of cell. Exemplary modifications are shown in FIG. 9.

Turning next to FIG. 5, a diagram depicting an exemplary cell 140 for the reduced cell library when employed with the Synopsys synthesis tool is shown. Cell 140 is a three input AND gate. Cell 140 defines an area attribute 142 occupied by the cell, a set of input pins 144A, 144B, and 144C, and an output pin 146. Each input pin 144 has a direction attribute 148 indicating that the pin is an input and an input capacitance attribute 150 represented in picoFarads. Input capacitance attribute 150 is equal to the $C_{in}$ capacitance 128 calculated from the delay model shown in FIG. 4 and the input parameters provided by the user.

Output pin 146 includes a direction attribute 148 indicating that the pin is an output, an output capacitance attribute 152 which is equal to the $C_{out}$ capacitance 122 assigned in the delay model shown in FIG. 4 (i.e. zero), and a function attribute 154. Function attribute 154 indicates the logical function represented by cell 140. In the case of cell 140, a three input AND function is performed. Output pin 146 further includes a timing attribute 156A–156C. Generally speaking, the output pin of a cell includes a timing attribute 156 corresponding to each input pin 144 which affects the output pin.

Each timing attribute 156 identifies the corresponding (or related) input pin 144 via a related pin attribute 158, the intrinsic rise and fall times of the cell for that input pin via an instruction rise attribute 160 and an intrinsic fall attribute 162, the rise and fall resistances (i.e. drive strengths) of the cell via a rise resistance attribute 164 and a fall resistance attribute 166, and the factors affecting timing due to the input slope for both rise and fall times via a slope rise attribute 168 and a slope fall attribute 170. For the RCL, slope rise attribute 168 and slope fall attribute 170 are set to zero (as noted above). Additionally, rise resistance attribute 164 and fall resistance attribute 166 are equal to the $R_{out}$ resistance calculated from the delay model shown in FIG. 4 and the input parameters provided by the user as shown in FIG. 6. Intrinsic rise attribute 160 and intrinsic fall attribute 162 are also calculated according to the delay model shown in FIG. 4 and the input parameters shown in FIG. 6, and are further modified according to the flowchart shown in FIG. 9.

Each cell in the RCL is formatted similar to cell 140, and the various attributes are calculated in a similar manner. Given a set of cells similar to cell 140, the synthesis tool may synthesize an RTL description into a netlist containing instantiations of the cells from the RCL. Furthermore, timing information for the RTL description can be calculated from the timing attributes and a wire delay model provided as an input parameter. The timing information can be evaluated against the design goals to determine if the RTL description synthesizes into a group of circuits which substantially meet the design goals. Additionally, area attribute 142 can be used to estimate the amount of die area occupied by the circuits corresponding to the RTL description, thereby estimating the RTL description against the area design goal.

Turning next to FIG. 6, a table 180 of input parameters used to generate one embodiment of a reduced cell library is shown. Some of the input parameters represent design goals, while other input parameters are not design goals but provide information used to generate the RCL.

A logic levels/clock cycle input parameter is provided as an estimate of the number of levels of logic which may be included in a clock cycle. The logic levels/clock cycle input parameter is a design goal based upon estimated properties of the semiconductor fabrication process to be used to fabricate the integrated circuit. A "logic level" refers to a basic logic function (e.g. NAND, NOR, AND, OR, etc.). Therefore, a given cell may comprise more than one logic level (particularly the cells which implement a complex logic function). Multiple levels of logic are connected together to calculate the next state equations of the RTL description.

A clock cycle time input parameter specifies the clock cycle time goal for the integrated circuit. The fanout parameter specifies the maximum fanout goal for the integrated circuit. If the maximum fanout goal is reached, then no output pin of a cell will be connected to more than a number of input pins greater than the maximum fanout goal.

A clock uncertainty input parameter is provided to indicate the amount of the clock cycle time which is devoted to handling uncertainty in the rising and falling edges of the clock cycle. Properties such as jitter may cause a particular clock cycle of the integrated circuit, during use, to be shorter than the desired clock cycle time. By dedicating a portion of the clock cycle time to clock uncertainty, the integrated circuit may still operate properly in the presence of a corresponding amount of jitter or other causes of uncertainty. Clock uncertainty is a design goal in that the design of the integrated circuit attempts to minimize the clock uncertainty actually experienced to a value less than the clock uncertainty input parameter.

A flip flop delay input parameter is provided. The flip flop delay input parameter indicates the amount of clock cycle time incurred by a flip flop storage circuit to capture an input signal and provide an output signal. This delay time reduces the amount of time available to the levels of logic. The flip flop delay is a design goal for the flip flop storage circuit. It is noted that any storage circuit may be modeled using the flip flop delay input parameter. Two other input parameters related to the flip flop storage delay are provide as well: a flip flop clock to Q time and a flip flop hold time. The flip flop clock to Q time parameter is a percentage. The percentage indicates the amount of the flip flop delay input parameter is devoted to the delay between the assertion of the clock input to the flip flop and the output signal validly providing the value of the input signal. The flip flop hold time indicates the required amount of time that the input signal to the flip flop remain valid after the assertion of the clock signal to guarantee the input signal is stored by the flip flop storage device. The flip flop clock to Q time input parameter and the flip flop hold time parameter are used to generate timing properties for the flip flop cell in the RCL.

The propagation delay input parameter specifies the percentage of a gate delay which is due to the intrinsic delay of the logic level. The gate delay is calculated using other input parameters as described in FIGS. 7 and 8 below, and is the amount of delay attributable to one logic level. A rise to fall ratio input parameter is provided for determining the difference in intrinsic delay of the logic level for rising and falling output signals. The intrinsic delay calculated by using the propagation delay input parameter is the average of the intrinsic rising and falling delays. Given the rise to fall ratio input parameter, intrinsic rising and falling delays can be calculated from the average intrinsic delay.

A wire delay input parameter is provided to indicate the amount of load delay (i.e. the difference between the gate delay and the intrinsic delay of the logic level) is attributable to the wiring delay between the current cell and the load cells (e.g. the $C_{wire}$ capacitance shown in FIG. 4). Given the wire delay input parameter, the $C_{wire}$ value can be calculated. Additionally, a wire load versus fanout table can be provided via the wire load versus fanout table input parameter. As will be appreciated by those skilled in the art, the value of $C_{wire}$ does not increase linearly with respect to the fanout of a particular output pin of a cell. The wire load versus fanout table provides a multiplier for wire load for each fanout value, based upon estimates of the semiconductor fabrication process to be used to manufacture the integrated circuit as well as the average distance to be traveled to reach each of the load cells for a given fanout. A corresponding wire load table can then be calculated by multiplying the $C_{wire}$ value calculated as described in FIG. 8 by the ratio of the multiplier corresponding to the fanout input parameter and the multiplier corresponding to the wire load value being calculated. The synthesis tool uses the wire load table to estimate wiring capacitance for a given instance of a cell based upon the actual fanout from that instance.

While the formerly described input parameters are design goals or are related to design goals, the remaining input parameters are not design goals but provide information for generating the RCL. An existing cell library is designated from which the cells to be included in the RCL can be read, as well as a list of the cells desired in the RCL. Cells within the list are located in the existing cell library. The format of the cell entry in the library is copied into the RCL. The area attribute 142 and the function attribute 154 are copied directly from the existing library. Other properties are calculated or set according to the delay model shown in FIG. 4 or the equations shown in FIG. 8. A reference cell from the existing library is selected, from which the drive strength as represented by the rise resistance and fall resistance attributes 164 and 166 are selected. The rise resistance and fall resistance of the reference cell are averaged to produce the rise resistance and fall resistance attributes 164 and 166 for each cell in the RCL. Hence, the average drive strength of the reference cell is the uniform drive strength for the cells in the RCL. It is noted that, in cases where a proposed cell is being considered for inclusion in the complete cell library used to synthesize the integrated circuit, the proposed cell may be inserted in the existing cell library and listed in the desired list of cells in order to have the proposed cell included in the RCL. Alternatively, the proposed cell may be entered into the RCL manually.

Because cells having differing numbers of inputs generally having differing intrinsic delays (due to increased series resistance of transistors in series and increased capacitance within the cell), the user may specify a delay table input parameter. The delay table input parameter specifies a multiplicative factor for each possible number of inputs to account for the difference in intrinsic delays based upon the number of inputs. As each cell in the RCL is created, the intrinsic rise and fall delays calculated according to the delay model and other input parameters are multiplied by the delay factor from the delay table which corresponds to the number of inputs for that cell. The resulting products form the intrinsic delays for that cell.

Finally, certain cells may imply, via the function attribute 154 read from the existing cell library, a delay of more than one logic level. If the enable multi-level parameter is set, then the function property 154 of the cell is examined to determine if multiple basic logic functions, performed in series, represent the function of the cell. If multiple series basic logic functions are detected, then the intrinsic delays for the cell are multiplied by the number of logic levels represented by the cell. In this manner, the intrinsic delays of the complex cells may be more accurately estimated.

It is noted that the term "design goal", as used herein, may equivalently be considered to be a design constraint. For example a design goal of 15 logic levels per clock cycle is equivalently a design constraint that no more than 15 logic levels be included in a clock cycle.

Figure 7:
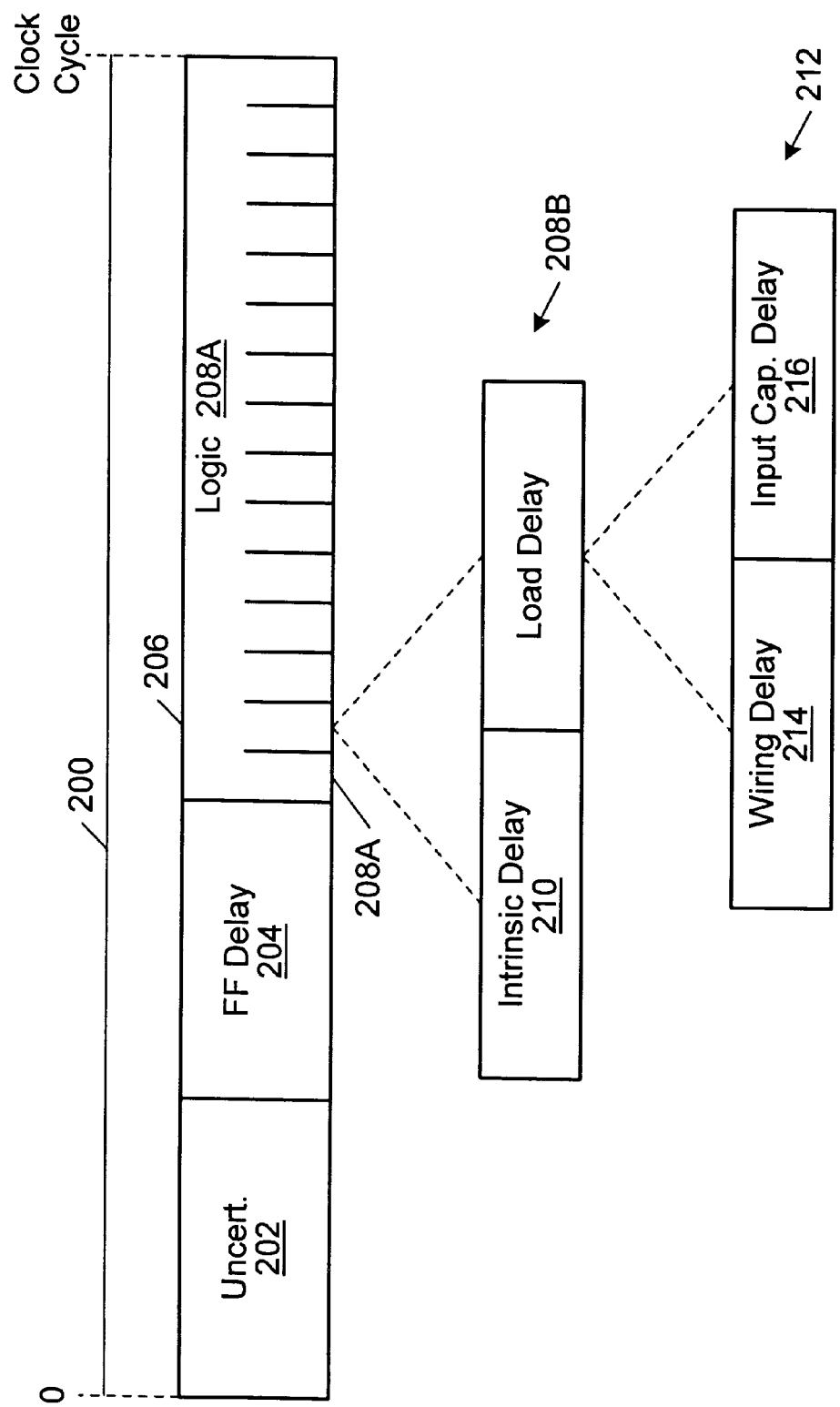
FIG. 7 is a diagram depicting a clock period and division thereof according to the parameters shown in FIG. 6.

Turning now to FIG. 7, a diagram of a clock cycle and division thereof according to the input parameters provided in FIG. 6 is shown. The clock cycle is divided in order to produce estimated intrinsic delays and capacitances for the reduced cell library. Line 200 indicates a period of time equal to one clock period as defined by the clock cycle time. The clock period is divided into three intervals 202, 204, and 206. Interval 202 is equal to the clock uncertainty input parameter, while interval 204 is equal to the flip flop delay input parameter. Subtracting intervals 202 and 204 from the clock period yields interval 206, which is the amount of time available for the levels of logic employed within a clock period to propagate an output signal of a flip flop storage device to the input signal of another flip flop storage device.

Interval 206 is subdivided into multiple equal gate delays such as gate delays 208A and 208B. The number of gate delays 208 is equal to the maximum number of logic levels per clock cycle as specified by the logic levels/clock cycle input parameter. Therefore, the amount of time represented by a gate delay 208 is the amount of time accorded for one logic level.

Gate delay 208B is exploded in FIG. 7 to indicate division of the gate delay into an intrinsic delay 210 and a load delay 212. The division of each gate delay 208 into intrinsic delay 210 and load delay 212 is specified by the propagation delay input parameter. Intrinsic delay 210 is an amount of time equal to the propagation delay percentage multiplied by the amount of time equal to a gate delay 208. Load delay 212 is the remaining amount of time in a gate delay 208 (i.e. the difference in a gate delay 208 and intrinsic delay 210).

Finally, load delay 212 is exploded in FIG. 7 to show the division of load delay 212 into a wiring delay 214 and an input capacitance delay 216. Wiring delay 214 is calculated by multiplying load delay 212 by the wire delay input parameter. Input capacitance delay 216 is the remaining amount of time in load delay 212 after subtracting wiring delay 214.

Not shown in FIG. 7 is the division of the flip flop delay (interval 204) into a clock to Q delay and a setup delay based on the flip flop clock to Q time parameter. The calculations are similar to those dividing a gate delay 208 into intrinsic delay 210 and load delay 212.

Turning next to FIG. 8, a set of equations for calculating the values shown in FIG. 7 given the input parameters of FIG. 6 is shown. Equation 220 calculates the value of gate delays 208 based upon the clock cycle time, the clock uncertainty, the flip flop delay, and the logic levels/clock cycle input parameters. Based upon the calculated gate delay, the intrinsic delay 210 is calculated from the propagation delay input parameter in equation 222. $C_{wire}$ (as shown in FIG. 4) is calculated using equation 224, wherein the difference between the gate delay and the intrinsic delay is the load delay 212. The numerator of equation 224 is the wiring delay 214, which is equal to $R_{out}$ multiplied by $C_{wire}$. Hence, dividing the wiring delay by $R_{out}$ (as found from the reference cell) yields $C_{wire}$. $C_{wire}$ can then be used with the wire load versus fanout table input parameter to generate a wire load table for inclusion in the reduced cell library.

Equation 226 is used to calculate the input capacitance attribute 150 for each cell (e.g. $C_{in}$). The numerator of equation 226 calculates the input capacitance delay 216, and dividing by the fanout and $R_{out}$ yields $C_{in}$. (See equations (1)–(3) above). Finally, the basic intrinsic rise and intrinsic fall values are calculated from the intrinsic delay calculated in equation 222 using equations 228 and 230. Equation 228 is derived from the fact that the intrinsic delay is the average of the basic intrinsic rise and intrinsic fall delays, and the basic intrinsic rise delay is the rise fall ratio input parameter multiplied by the basic intrinsic fall delay. Given the basic intrinsic rise and intrinsic fall delays calculated via equations 228 and 230, intrinsic rise attribute 160 and intrinsic fall intrinsic 162 for each individual cell can be generated by multiplying the basic intrinsic rise and fall delays (respectively) by the corresponding delay table value from the delay table input parameter. Additional modifications to the basic intrinsic rise and fall delays may be made as well. FIG. 9 is an example of the modifications which may be made.

Equations 232 and 234 calculate additional attributes for the flip flop storage device cell. The clock to Q delay is calculated by multiplying the flip flop clock to Q time input parameter (a percentage) by the flip flop delay input parameter. The difference between the clock to Q delay and the flip flop delay input parameter is the setup delay.

Turning now to FIG. 9, a flowchart depicting activities performed by a program (or UNIX shell script, according to one embodiment) in order to generate a reduced cell library according to the present embodiment. Alternatively, the steps of the flowchart could be performed manually.

Prior to generating values for the cells to be included in the RCL, the basic attributes (or properties) for cells in the RCL are calculated according to the equations shown in FIG. 8 based on the input parameters shown in FIG. 6 (step 250). The remaining steps in the flowchart are repeated for each cell to be included in the RCL. It is noted that, for the present embodiment, drive strength and input capacitance is constant for each of the cells in the RCL. Other embodiments may vary one or both of these attributes.

The basic intrinsic delays generated in step 250 are first modified with respect to the appropriate entry from the delay table input parameter (step 252). Particularly, an entry from the delay table is selected based upon the number of input pins to the cell (i.e. each entry in the delay table corresponds to a different number of input pins). The basic intrinsic delays are multiplied by the selected entry.

Additionally, if the multi-level enable input parameter is set, then the function property 154 of the cell is examined to determine if the cell corresponds to more than one logic level. If so, then the intrinsic delays between a given input to the cell and the output of the cell is multiplied by the number of logic levels between that input and the output (decision block 254 and step 256). If the multi-level enable input parameter is clear, then the intrinsic delays are not multiplied by the number of levels of logic between each input to the cell and the corresponding output (decision block 254).

Certain cells, although their function implies a single level of logic, may include more than one level due to the technology in which the cells are to be implemented. For example, in CMOS logic AND and OR cells are NAND and NOR cells (respectively) with inverted outputs. For cells including such inverted outputs, the intrinsic delays are lengthened. A delay equal to an inverter delay (i.e. a one input cell) is added to cells having inverted outputs (step 258). The added delay thereby accounts for the output inverter.

Similar to step 258, the intrinsic delay between an input pin which is inverted prior to performing the logic function for the cell and the output pin is increased (step 260). A delay equal to ½ of a single input cell (i.e. an inverter delay) is added to inverted inputs. A delay of ½ of an inverter delay is added to provide a motivation for the synthesis tool to use the cell with inverted inputs over a cell with non-inverted inputs with inverters connected to the inputs to be inverted. The resulting synthesis result may be more accurate using the gates with inverted inputs. It is noted that an inverter delay (or the intrinsic delay of a single input cell) is the basic intrinsic delay multiplied by the first entry in the delay table.

As mentioned above, steps 252–260 are repeated for each cell to be included in the RCL. Decision box 262 causes the flowchart to return to step 252 if additional cells are to be added to the RCL. Otherwise, the RCL is generated and can be saved for use in synthesizing an RTL description.

Turning next to FIGS. 10–12, an example of the calculations for forming a reduced cell library is shown, as well as the intrinsic delays for some exemplary cells for the RCL. FIG. 10 shows the input parameter values for table 180, exclusive of the existing cell library and the list of desired cells. FIG. 11 shows the values provided in FIG. 10 being applied to equations 220–234. Additionally, an exemplary wire load table 280 is shown. The exemplary wire load table is calculated from the wire load vs. fanout table input parameter and the wire load $C_{wire}$ calculated for a fanout of three. Each of the other wire loads in the wire load table can be calculated by dividing the corresponding entry in the wire load vs. fanout table by the entry for a fanout of three (e.g. 0.3375) and multiplying by the value of $C_{wire}$. Hence, the wire load for a fanout of one is 0.033 pF while the wire load for a fanout of four is 0.132 pF in the present example.

FIG. 12 shows several exemplary cells for the RCL and the corresponding intrinsic delay calculations. Cell 290 is a 2 input NAND gate. Since the NAND gate is a single level of logic and does not have an inverted output in CMOS, the intrinsic delays need only be multiplied by the entry from the delay table input parameter for two input gates (0.88). Alternatively, a three input AND gate does have an inverted input, and therefore is multiplied by the sum of the entry from the delay table for three inputs (1.0) and an inverter delay (0.82). Finally, a complex cell is shown. The complex cell has a two level logic function (two first level ORs followed by a second level AND). Therefore, the intrinsic delays are multiplied by the entry from the delay table corresponding to four inputs (1.43) and the number of logic levels between the inputs and the outputs (2).

In accordance with the above disclosure, a method for designing an integrated circuit using an reduced cell library has been disclosed. The reduced cell library enables significantly faster compilations than using a complete cell library. RTL evaluation and experimental changes may be more easily and efficiently performed using the RCL. Furthermore, proposed additional cells may be evaluated by including the additional cells in the RCL. The RCL is not based on characterized circuits, and therefore can be generated even when a complete library is unavailable (i.e. under construction).

Numerous variations and modifications will become apparent to those skilled in the art once the above disclosure is fully appreciated. It is intended that the following claims be interpreted to embrace all such variations and modifications.

What is claimed is:

1. A method for designing an integrated circuit, comprising:
   generating a reduced cell library, wherein each cell of said reduced cell library is characterized by a uniform drive strength, wherein said generating a reduced cell library comprises calculating a set of basic attributes of said cells within said reduced cell library from a set of input values derived from design goals for said integrated circuit, and wherein said basic attributes include an intrinsic delay and an input capacitance, and wherein said generating a reduced cell library further comprises calculating said intrinsic delay from a gate delay which is calculated by dividing a clock period specified for said integrated circuit by a number of logic levels includable within said clock period according to a specification of a semiconductor fabrication process to be used to manufacture said integrated circuit; and
   synthesizing an RTL representation of said integrated circuit using cells defined only within said reduced cell library.

2. The method as recited in claim 1 further comprising refining said RTL representation via an analysis of a result of said synthesizing using said reduced cell library.

3. The method as recited in claim 2 wherein said refining comprises reorganizing said RTL representation to achieve a synthesis result which closely approximates a design goal of said integrated circuit, and wherein said reorganizing maintains Boolean equivalency to said RTL representation prior to said reorganizing.

4. The method as recited in claim 2 wherein said refining comprises changing a logical operation defined by said RTL representation to achieve a design goal of said integrated circuit, whereby a Boolean equivalency is discarded between said RTL representation prior to said refining and said RTL representation subsequent to said refining.

5. The method as recited in claim 2 further comprising synthesizing said RTL representation using a second cell library comprising a second set of cells, wherein said second set of cells includes a first cell and a second cell corresponding to a particular logic function, and wherein said first cell is characterized by a first drive strength, and wherein said second cell is characterized by a second drive strength, and wherein said first drive strength is greater than said second drive strength.

6. The method as recited in claim 1 further comprising defining an additional cell for inclusion in said reduced cell library.

7. The method as recited in claim 6 further comprising generating a second reduced cell library, wherein said second reduced cell library includes said reduced cell library and said additional cell, said additional cell characterized by said uniform drive strength which characterizes said cells of said reduced cell library.

8. The method as recited in claim 7 further comprising resynthesizing said RTL representation using said second reduced cell library and analyzing a second result of said resynthesizing, and still further comprising evaluating said additional cell according to usage of said additional cell during said resynthesizing.

9. The method as recited in claim 1 wherein said generating a reduced cell library further comprises modifying said intrinsic delay for each cell within said reduced cell library according to a number of input pins in said cell of said reduced cell library.

10. The method as recited in claim 1 wherein said generating a reduced cell library further comprises multiplying said intrinsic delay by a number of levels of logic represented by a particular cell within said reduced cell library, thereby arriving at a particular intrinsic delay for said particular cell.

11. The method as recited in claim 1 wherein said generating a reduced cell library further comprises adding an additional delay to said intrinsic delay of a particular cell within said reduced cell library to account for an inverted output of said particular cell.

12. The method as recited in claim 1 wherein said generating a reduced cell library further comprises adding an additional delay to said intrinsic delay of a particular cell within said reduced cell library to account for an inverted input of said particular cell.

13. The method as recited in claim 1 wherein said generating a reduced cell library further comprises reducing said clock period by a first amount corresponding to a clock uncertainty specified for said integrated circuit and a second amount corresponding to a delay associated with a clocked storage device, said clock period being reduced prior to said dividing.

14. A method for designing an integrated circuit, comprising:

generating a reduced cell library, wherein each cell of said reduced cell library is characterized by a uniform drive strength, wherein said generating a reduced cell library comprises calculating a set of basic attributes of said cells within said reduced cell library from a set of input values derived from design goals for said integrated circuit, and wherein said design goals include a clock period, a maximum fanout, a maximum number of logic levels per said clock period, a propagation delay as a percentage of a gate delay, a rise to fall ratio defining the difference in said intrinsic delay for rising and falling output signals, and a wire delay as a percentage of said gate delay attributable to capacitance; and synthesizing an RTL representation of said integrated circuit using cells defined only within said reduced cell library.

15. A method for designing an integrated circuit, comprising:

generating a reduced cell library including a plurality of cells;

estimating a gate delay for each one of said plurality of cells in response to a clock period design goal for said integrated circuit, wherein said estimating comprises:

subtracting a clock uncertainty parameter and a flip flop delay parameter from said clock period design goal; and dividing a result of said subtracting into a number of equal sized time periods, said number specified by a logic levels per clock cycle design goal; and synthesizing an RTL representation of said integrated circuit using only said plurality of cells.

* * * * *